United States Patent [19]
Song et al.

[11] Patent Number: 5,309,100
[45] Date of Patent: May 3, 1994

[54] FLOW MEASUREMENT OF INCOMPRESSIBLE FLUID USING DIVERGENCE-FREE CONSTRAINT

[75] Inventors: Samuel M. Song, San Mateo; Sandy A. Napel, Menlo Park; Norbert J. Pelc, Los Altos, all of Calif.

[73] Assignee: Board of Trustees of the Leland Stanford Junior University, Stanford, Calif.

[21] Appl. No.: 968,754

[22] Filed: Oct. 30, 1992

[51] Int. Cl.$^5$ .......................................... G01R 33/20
[52] U.S. Cl. ................................................. 324/306
[58] Field of Search ............... 324/300, 307, 306, 309, 324/318, 322

[56] References Cited

U.S. PATENT DOCUMENTS

4,862,080  8/1989  Hendrik Van as ................... 324/306

OTHER PUBLICATIONS

Song, "Improvement of Vessel Conspicuity of 3D Phase Contrast MRI by Application of a Divergence–free Constraint," Scty. of Mag. Res. in Med., 11th Ann. Sci. Mtg., Berlin, Aug. 8–14, 1992.
Dumoulin, "Quantitative Measurement of Blood Flow Using Cylindrically Localized Fourier Velocity Encoding," Mag. Res. in Med., vol. 21, pp. 242–250, 1991 (no month).
Walton, "Flow Velocity Measurement with ac Gradients," Mag. Res. in Med., vol. 4, pp. 274–281, 1987 (no month).
Hu, "Localized Real–Time Velocity Spectra," Aug. 10, 1991, p. 1158 (no month).
Pearlman, "Real–Time MR Beam–directed Velocity Mapping: V–Mode MR Imaging," J. Mag. Res. Img., Mar./Apr. 1991, p. 154.
Dumoulin, "Three–Dimensional Phase Contrast Angiography," Mag. Res. in Med., vol. 9, pp. 139–149, 1989 (no month).
Brown, "Contrast–to–Noise Ratios in Maximum Intensity Projection Images," Mag. Res. in Med., vol. 23, pp. 130–137, 1992 (no month).
Song, "Computation of 3–D Velocity Fields from 3–D Cine CT Images of a Human Heart," IEEE Trans. on Med. Img., vol. 10, No. 3, Sep. 1991, pp. 295–306.
Girault, *Finite Element Methods for Navier–Stokes Equations*, Published by Springer–Verlag, pp. 1–57 (Mar. 1986).
Simard, "A Projection Operator for the Restoration of Divergence–Free Vector Fields," IEEE Trans. on Pattern Analysis and Machine Intell., vol. 10, No. 2, Mar. 1988.
Pelc, "Encoding Strategies for Three–Direction Phase–Contrast MR Imaging of Flow," Jrnl. Med. Res. Img., Jul./Aug. 1991, pp. 405–413.

*Primary Examiner*—Michael J. Tokar
*Attorney, Agent, or Firm*—Townsend and Townsend Khourie and Crew

[57] ABSTRACT

A method and apparatus to reduce the noise in three-dimensional phase contrast magnetic resonance velocity measurements exploits the property that blood is incompressible and therefore the velocity field describing its flow must be divergence-free. The divergence-free condition can be incorporated by the projection operation on Hilbert space where the velocity measurements are projected onto the space of divergence-free velocity fields. The reduction of noise is achieved since the projection operation eliminates the noise component that is not divergence-free. Higher quality angiograms are produced due to the noise reduction in the velocity measurement signals.

29 Claims, 14 Drawing Sheets

FLOW MEASUREMENT OF INCOMPRESSIBLE FLUID USING DIVERGENCE-FREE CONSTRAINT

BACKGROUND OF THE INVENTION

This invention relates generally to fluid velocity measurement and imaging, and more particularly the invention relates to improved velocity measurement of an incompressible fluid using divergence-free constraint of true velocity.

Several technologies including Doppler ultrasound and magnetic resonance (MR) are known for measuring and imaging fluid flow. In Doppler ultrasound, the phase of reflected ultrasonic waves due to the flow of fluid provides a measure of velocity. In magnetic resonance imaging, bipolar flow encoding gradients can be used in a three-dimensional MRI procedure to provide a measure of flow. Pelc et al. "Encoding Strategies for Three Direction Phase Contrast MR Imaging of Flow" *Journal of Magnetic Resonance Imaging*, Vol. I, No. 4, pp. 405–413, 1991 discloses encoding strategies for the measurement of flow velocities in arbitrary directions with phase-contrast magnetic resonance imaging.

Phase sensitive MR methods of flow measurement have certain limitations. For example, velocity induced phase shift is proportional to velocity, and dispersions in velocity result in dispersions of phase shift which, in turn, can result in attenuation of observable signal when the flow is complex. Further, imaging of blood flow in blood vessels necessitates a high signal to noise ratio to provide adequate image resolution. As described by Dumoulin et al. "Three Dimensional Phase Contrast Angiography" *Magnetic Resonance in Medicine* 9, pp. 139–149 (1989), three-dimensional Fourier transform (3DFT) imaging can be used to avoid some of the problems of phase sensitive flow techniques.

The 3DFT imaging provides a high signal noise ratio for a given time span because each acquired echo contains signals from all image voxels. Further, the volume imaging can unambiguously identify the location of a small vessel in surrounding anatomy. Thus, MR angiograms can be produced by computing the speed at each voxel and reprojecting the computed speed at one or more viewing angles.

The present invention is directed to reducing noise and increasing conspicuity of phase contrast velocity measurements and images.

SUMMARY OF THE INVENTION

In accordance with the invention, noise in three-dimensional velocity measurements is reduced by exploiting the property that a fluid such as blood is incompressible thus the velocity field describing this flow must be divergence-free. The divergence-free condition is incorporated by a projection operation on Hilbert space.

In one embodiment the velocity measurement is generated by phase contrast MR and is projected onto the space of divergence-free velocity fields. The reduction in noise is realized because the projection operation eliminates the noise component that is not divergence-free.

Several techniques can be employed to obtain the projection onto the space of divergence-free fields including a Lagrange multiplier method, a linear algebraic formulation, and a least squares method.

The invention and objects and features thereof will be more readily apparent from the following detailed description and appended claims when taken with the drawings.

DETAILED DESCRIPTION OF ILLUSTRATIVE EMBODIMENTS

Figure 1A:
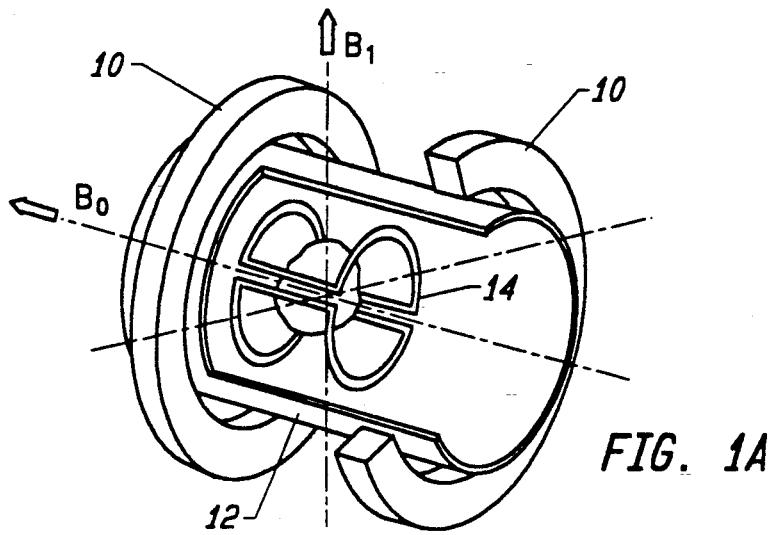
FIG. 1 is a perspective view partially in section illustrating coil apparatus in a MR imaging system.
FIGS. 1B–1D illustrate field gradients which can be produced in the apparatus of FIG. 1.
Figure 1B:
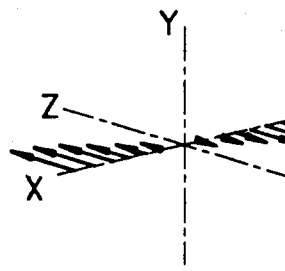
Figure 1C:
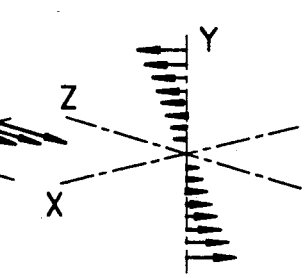
Figure 1D:
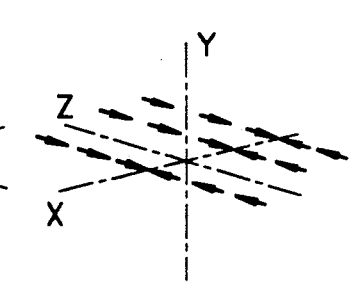

The invention can be practiced using different technologies, and the following described embodiment uses magnetic resonance imaging (MRI). Referring to the drawing, FIG. 1A is a perspective view partially in section illustrating coil apparatus in a MR imaging system, and FIGS. 1B–1D illustrate field gradients which can be produced in the apparatus of FIG. 1A. This apparatus is discussed by Hinshaw and Lent, "An Introduction to NMR Imaging: From the Bloch Equation to the Imaging Equation," *Proceedings of the IEEE*, Vol. 71, No. 3, March 1983, pp. 338–350. Briefly, the uniform static field $B_o$ is generated by the magnet comprising the coil pair 10. A gradient field $G_x$ is generated by a complex gradient coil set which can be wound on the cylinder 12. An RF field $B_1$ is generated by a saddle coil 14. A patient undergoing imaging would be positioned along the Z axis within the saddle coil 14.

In FIG. 1B an X gradient field is shown which is parallel to the static field $B_o$ and varies linearly with distance along the X axis but does not vary with distance along the Y or Z axes. FIGS. 1C and 1D are similar representations of the Y gradient and Z gradient fields, respectively.

Figure 2:
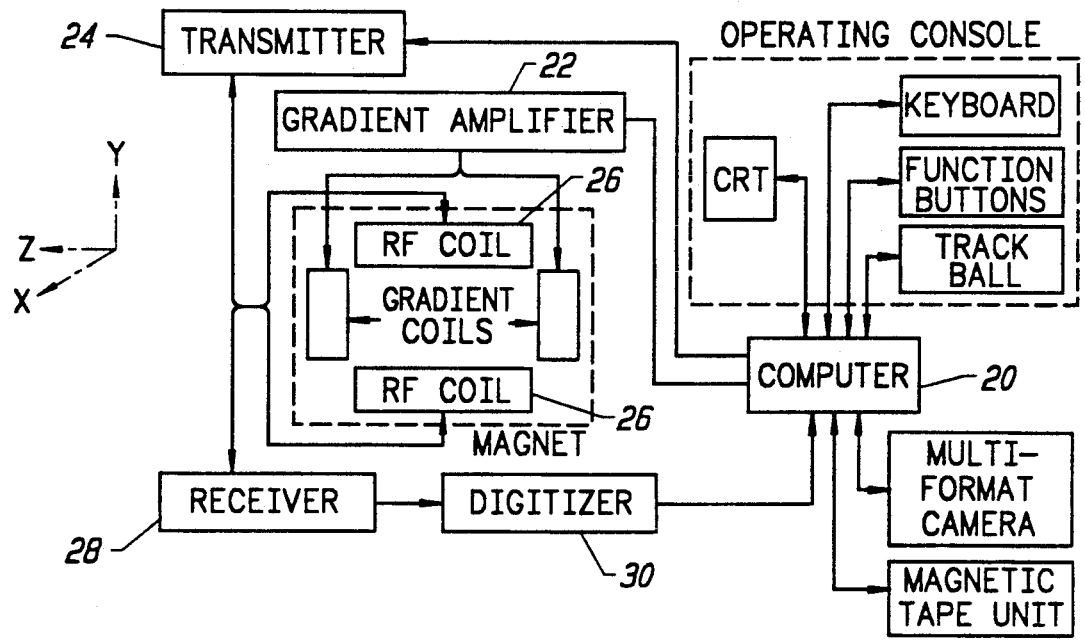
FIG. 2 is a functional block diagram of MR imaging apparatus useful in practicing the present invention.

FIG. 2 is a functional block diagram of the imaging apparatus as disclosed in *NMR—A Perspective on Imaging*, General Electric Company, 1982. A computer 20 is programmed to control the operation of the NMR apparatus and process signals detected therefrom. The gradient field is energized by a gradient amplifier 22, and the RF coils for impressing an RF magnetic moment at the Larmor frequency is controlled by the transmitter 24 and the RF coils 26. After the selected nuclei have been flipped, the RF coils 26 are employed to detect the signal which is passed to the receiver 28 and thence through digitizer 30 for processing by computer 20.

Pelc et al. "Encoding Strategies for Three Direction Phase Contrast MR Imaging of Flow", supra, describes the measurement of all 3 components (i.e., all directions) of a vector velocity field with phase contrast magnetic resonance imaging. In accordance with the present invention, noise in the three-dimensional, all directions, phase contrast (PC) velocity measurements is reduced by exploiting the property that a fluid such as blood is incompressible thus the velocity field describing this flow must be divergence-free. In the following description of the preferred embodiment, the divergence-free condition is incorporated by a projection operation on Hilbert space.

The method of projection onto convex sets is an operation that projects the data onto the prescribed convex set. We introduce the method of projection onto the space of divergence-free fields (PSDF) which projects 3-D velocity field measurements onto the space of divergence-free fields. The result of this projection is the divergence-free velocity field that is closest to the measured field. This field contains less noise since the noise component that is not divergence-free is eliminated. Therefore, the PSDF method reduces noise in PC MR velocity measurements, which in turn improves the contrast of PC MR angiograms.

In accordance with this invention, we reduce the noise in the velocity field made available by 3-D PC MRI by using a priori knowledge that the true velocity field is divergence-free. The noise reduction has been demonstrated using a mathematical phantom, a flow phantom, and some in vivo studies. For a fast implementation, we extend the fast 2-D Poisson solver to 3-D and obtain the divergence-free velocity field by the method of PSDF.

Following are some pertinent mathematical concepts to develop the operator that takes a vector field and projects it onto the space of divergence-free vector fields. Let $\Omega$ be a region in 3-D space—for instance, the imaging volume—and $\delta\Omega$ the surface enclosing $\Omega$. Consider the Hilbert space $L_2(\Omega)^3 = L_2(\Omega) \times L_2(\Omega) \times L_2(\Omega)$ with its usual inner product and its induced norm:

$$<s_1, s_2> = \int_\Omega s_1(x, y, z) \cdot s_2(x, y, z) d\Omega \quad (1)$$

$$\|s\|_2^2 = <s, s> \quad (2)$$

where $s, s_1, s_2 \in L_2(\Omega)^3$ and $d\Omega = dx\, dy\, dz$. We introduce $M \subset L_2(\Omega)^3$, the space of divergence-free vector fields, mathematically defined as below:

$$M = \{m \in L_2(\Omega)^3 : \nabla \cdot m = 0\} \quad (3)$$

It is trivial to show that $\overline{M}$, the closure of $M$, is a closed subspace of $L_2(\Omega)^3$. It follows that, for every $s \in L_2(\Omega)^3$, there exists a unique $m_0 \in \overline{M}$, which solves the optimization problem:

$$\inf_{m \in M} \|m - s\|_2^2 \quad (4)$$

Roughly speaking, s is the velocity measurement, for instance, given by 3-D PC MRI, and we wish to find the solution of Equation (4). A necessary and sufficient condition for $m_0 \in \overline{M}$ to be a unique minimizer is that $s - m_0$ be orthogonal to $M$. In other words, $s - m_0 \in M^\perp$.

We proceed to obtain the following projection operator:

$$P: L_2(\Omega)^3 \to M \quad (5)$$

$$P: s \to m \quad (6)$$

There exist a number of techniques for obtaining orthogonal projectors such as P above. In fluid mechanics such projectors are provided for a space similar to M; however, the normal component of $m \in M$ is restricted to vanish on $\delta\Omega$. The analysis of most fluid mechanical systems allows this restriction as the fluid is not expected to flow through the bounding structure $\delta\Omega$, for instance, the enclosing pipe. In our case, this is not a desired restriction. In general, 3-D velocity images contain only a portion of the whole body. Therefore, the blood and/or other structures such as the myocardium are expected to move in and out of the imaging volume $\Omega$, through the boundary $\delta\Omega$. Thus, the normal component of the velocity on $\delta\Omega$ is not expected to be zero.

One approach for obtaining P is by solving the constrained optimization problem by the Lagrange multiplier method. The projector can be shown to be:

$$Ps = x - \nabla p \quad (7)$$

where p is a solution of the Dirichlet problem:

$$\nabla^2 p = \nabla \cdot s \text{ on } \Omega$$

$$p = 0 \text{ on } \Omega \quad (8)$$

Algorithmically, the solution can be summarized as follows:

Find the solution p of the Dirichlet problem—Equation (8).

With p just obtained, find $m_0 = Ps$ using Equation (7).

The above mathematical process will be referred to as the method of projection onto the space of divergence-free fields (PSDF).

We note that even though the projected velocity $m_0 = Ps$ may be divergence-free, the projector P does not eliminate all the noise in the velocity measurement s. This becomes clear if we model the measurement as containing additive noise, for instance, $$s = s_0 + n \quad (9)$$

where $s_0$ is the true velocity and n is the additive noise. By considering n as a realization of the underlying random process, it may be decomposed as $$n = n_M + n_{M^\perp} \quad (10)$$

where $n_M \in \overline{M}$ and $n_{M^\perp} \in M^\perp$. That is, $n_M$ is the noise component that is divergence-free while $n_{M^\perp}$ is not divergence-free. The projected velocity may then be decomposed as $$Ps = P(s_0 + n)$$
$$= s_0 + n_M.$$

Figure 3:
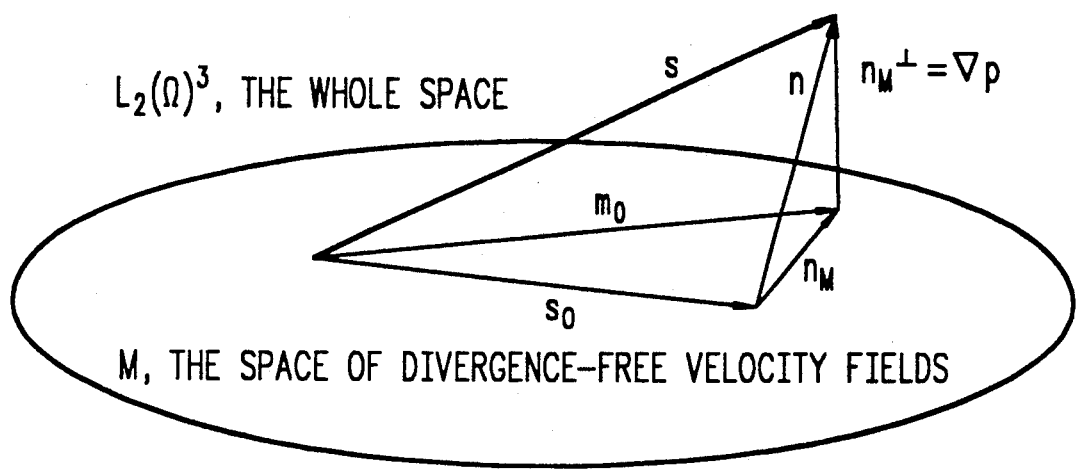
FIG. 3 illustrates Hilbert space and its subspace.

Therefore, although $n_M\perp$ can be eliminated by the projection operator P, the divergence-free noise component, $n_M$, remains additive. This is graphically illustrated in FIG. 3. Numerical examples to quantify this effect are given below.

Consider now the design of the discrete projector $\underline{P}$ by discretizing P. However, it may be of interest to determine whether the discrete projector can be obtained directly without the use of the Hilbert space setting of the previous section.

Let $\underline{E}$ be the matrix representation of $\nabla\cdot$ (the divergence operator). We wish to project the velocity measurement onto $N(\underline{E})$, the null space of $\underline{E}$, i.e., the space of discretely divergence-free velocity fields. We note that the projection onto the range space $R(\underline{E}^T)$, is achieved by $\underline{E}^T(\underline{E}\underline{E}^T)^{-1}\underline{E}$, assuming that $\underline{E}$ is full-rank. Therefore, the projection operator that projects onto $N(\underline{E})=R(\underline{E}^T)$ is given by:

$$\underline{I}-\underline{E}^T(\underline{E}\underline{E}^T)^{-1}\underline{E} \quad (11)$$

It is left to specify the divergence operator $\underline{E}$. The difficulty of specifying $\underline{E}$ lies in the fact that the divergence cannot be consistently defined on the boundary $\delta\Omega$. Whether we choose to use the forward, backward, or central differencing scheme, the operator $\underline{E}$ cannot be completely specified without any boundary conditions. Hence, although seemingly simple, the direct procedure above cannot be used if a complete solution is desired.

Therefore, the numerical solution must be obtained by discretizing the projector P of Equation (7). We begin with the discretization of the velocity field $s=(u,v,w)$ where u,v and w are x,y and z-components of s, respectively. Assuming uniform sampling, let the spatial sample grid spacings be $\Delta_x$, $\Delta_y$ and $\Delta_z$ for the x,y and z-axis respectively, and let $$u_{ijk}=u(x,y,z)|_{(x,y,z)=(i\Delta x, j\Delta y, k\Delta z)}, \quad (x,y,z)\in\Omega \quad (12)$$

Using lexicographical ordering, the x-component of the discrete velocity $u_{ijk}$ can be vector-stacked, for instance, $\underline{u}=[u_{000}, \ldots, u_{ijk}, \ldots]^T$ where $T$ indicates transpose. Other components of the velocity $\underline{v}$ and $\underline{w}$ are similarly constructed. The discrete velocity vector $\underline{s}$ is then constructed as $$s = \begin{bmatrix} u \\ v \\ w \end{bmatrix} \quad (13)$$

With the above discretization and in view of Equations (7) and (8), we expect the discrete projector $\underline{P}$ to be of the following form:

$$\underline{P}\underline{s}=\underline{s}-\underline{G}\underline{L}^{-1}\underline{D}\underline{s} \quad (14)$$

where $\underline{G}$, $\underline{L}$ and $\underline{D}$ are matrix representations of the gradient, Laplacian and divergence operators, respectively. The Laplacian operator $\underline{L}$ must be designed so that the Dirichlet boundary condition $p=0$ on $\delta\Omega$ is incorporated.

The bulk of the computation is involved in solving the Poisson equation, represented by $\underline{L}^{-1}$. The discretization of the Laplacian $\nabla^2$ must result in an algorithm with a reasonable computational requirement so that the operation $\underline{L}^{-1}$ is practical. Numerical solutions of the Poisson equation are well developed for certain models of $\underline{L}$. In particular, the Poisson equation based on the 7-point 3-D Laplacian mask below can be efficiently implemented via the fast Fourier transform (FFT).

$$\nabla^2 f_{ijk} = -(4 + 2h_z^2)f_{ijk} + f_{i-1jk} + \\ f_{i+1jk} + f_{ij-1k} + f_{ij+1k} + (f_{ijk-1} + f_{ijk+1})h_z^2 \quad (15)$$

where $h_z$ is the aspect ratio $\Delta_x/\Delta_z$, and for simplicity, we have assumed the usual imaging situation $\Delta_x=\Delta_y$ and normalized the distance $\Delta_x=1$.

In view of Equation (14), the specification of the gradient and divergence operators $\underline{G}$ and $\underline{D}$ remains. We note that using the forward difference in defining $\underline{D}$ yields the 7-point Laplacian $\underline{L}=-\underline{D}\underline{D}^T$, for the Dirichlet problem—Equation (8) with the Dirichlet boundary condition, $p=0$ on $\delta\Omega$. Furthermore, by defining $\underline{G}=-\underline{D}^T$, i.e., the backward difference gradient, one can show that $\underline{G}$ also incorporates the Dirichlet boundary condition on $\delta\Omega$. Therefore, the resulting discrete projector can be described as below:

$$\underline{P}\underline{s} = \underline{s} - \underline{D}^T(\underline{D}\underline{D}^T)^{-1}\underline{D}\underline{s}$$
$$= (\underline{I} - \underline{D}^T(\underline{D}\underline{D}^T)^{-1}\underline{D})\underline{s}$$

We note that $\underline{P}$ is an exact projector, i.e., the discrete divergence of the projected velocity will be exactly zero as shown below:

$$\underline{D}\underline{P}\underline{s} = \underline{D}(\underline{I} - \underline{D}^T(\underline{D}\underline{D}^T)^{-1}\underline{D})\underline{s}$$
$$= (\underline{D} - \underline{D})\underline{s} = 0$$

Consider now the construction of $\underline{D}$ and $\underline{L}$. Let the discrete spatial extent of samples of the velocity measurement s be $N_x \times N_y \times N_z$ and without loss of generality, assume that s is constructed such that the fastest changing index is along x followed by y and z. Let $$\mathbf{D}_{x0} = \begin{bmatrix} -1 & 1 & & & \\ & \ddots & \ddots & & \\ & & & -1 & 1 \end{bmatrix} \text{ and }$$

$$\mathbf{D}_{x1} = \begin{bmatrix} \mathbf{D}_{x0} & & \\ & \ddots & \\ & & \mathbf{D}_{x0} \end{bmatrix}$$

be $(N_x-1)\times N_x$ and $(N_x-1)(N_y-1)\times N_xN_y$ matrices respectively. They represent derivative operators (forward difference) with respect to x for one row (for instance y,z=0) and one slice (for instance z=0), respectively. Therefore, $$\mathbf{D}_x = \begin{bmatrix} \mathbf{D}_{x1} & & \\ & \ddots & \\ & & \mathbf{D}_{x1} \end{bmatrix} \quad (16)$$

of dimension $(N_x-1)(N_y-1)(N_z-1) \times N_x N_y N_z$ is the derivative with respect to x for all slices. Other components of the divergence operator $\underline{D}_y$ and $\underline{D}_z$ can similarly be constructed. Therefore, the divergence operator can be constructed as below:

$$\underline{D} = [\underline{D}_x | \underline{D}_y | \underline{D}_z] \quad (17)$$

It can be shown that $\underline{D}$ is a full-rank matrix and thus the Laplacian matrix $\underline{L} = -\underline{D}\underline{D}^T$ is invertible.

For constructing $\underline{L}$, define the following tri-diagonal matrix of dimension $(N_x-1) \times (N_x-1)$.

$$L_0 = \begin{bmatrix} -4-2h_z^2 & 1 & & & & & \\ 1 & -4-2h_z^2 & 1 & & & & \\ & 1 & -4-2h_z^2 & 1 & & & \\ & & & \ddots & & & \\ & & & 1 & -4-2h_z^2 & 1 & \\ & & & & 1 & -4-2h_z^2 & 1 \\ & & & & & 1 & -4-2h_z^2 \end{bmatrix} \quad (18)$$

The matrix $\underline{L}_0$ has a special toeplitz structure that can be diagonalized by a sine transform whose eigenvalues are $$\lambda(L_0) = -4 - 2h_z^2 + 2\cos\frac{l\pi}{N_x} \quad (19)$$

where $l = 1, 2, \ldots, N_x - 1$. We next define the block tri-diagonal matrix of dimension $(N_x-1)(N_y-1) \times (N_x-1)(N_y-1)$.

$$L_1 = \begin{bmatrix} L_0 & I_0 & & & \\ I_0 & L_0 & I_0 & & \\ & & \ddots & & \\ & & I_0 & L_0 & I_0 \\ & & & I_0 & L_0 \end{bmatrix} \quad (20)$$

where $\underline{I}_0$ is the identity matrix whose dimensions are the same as $\underline{L}_0$.

Finally, the Laplacian matrix $\underline{L}$ can be shown to be a matrix of dimension $(N_x-1)(N_y-1)(N_z-1) \times (N_x-1)(N_y-1)(N_z-1)$.

$$L = \begin{bmatrix} L_1 & h_z^2 I_1 & & & \\ h_z^2 I_1 & L_1 & h_z^2 I_1 & & \\ & & \ddots & & \\ & & h_z^2 I_1 & L_1 & h_z^2 I_1 \\ & & & h_z^2 I_1 & L_1 \end{bmatrix} \quad (21)$$

where $\underline{I}_1$ is the identity matrix whose dimensions are the same as $\underline{L}_1$. One can show that $-\underline{D}\underline{D}^T$ exactly matches the construction of the Laplacian matrix by a term by term comparison of $$-\underline{D}\underline{D}^T = -\underline{D}_x\underline{D}_x^T - \underline{D}_y\underline{D}_y^T - \underline{D}_z\underline{D}_z^T$$

and $\underline{L}$ as shown in Equation (21).

One can show that the eigenvalues of $\underline{L}$ are $$\lambda(L) = -4 - 2h_z^2 + 2\cos\frac{l_x\pi}{N_x} + 2\cos\frac{l_y\pi}{N_y} + 2h_z^2\cos\frac{l_z\pi}{N_z} \quad (22)$$

where
$l_x = 1, 2, \ldots, N_x - 1$
$l_y = 1, 2, \ldots, N_y - 1$
$l_z = 1, 2, \ldots, N_z - 1$ We note that the eigenvalues $\lambda(\underline{L})$ are strictly negative. Therefore, $\underline{L}$ must be negative definite and hence invertible.

It can also be shown that the eigenvectors of $\underline{L}$ are the columns of the sine transform matrix $\underline{S}$ so that $\underline{L} = \underline{S}\Lambda\underline{S}$ where $\Lambda$ is the diagonal matrix with the eigenvalues $\lambda(\underline{L})$ on the diagonal. Therefore, the problem $Lx=b$ may be solved via $\underline{X} = \underline{S}\Lambda^{-1}\underline{S}b$. The sine transform $\underline{S}$ can be efficiently implemented via the FFT. However, a faster algorithm can result by extending the 2-D fast Poisson solver to 3-D.

We summarize the resulting numerical algorithm to obtain Ps as below:
Compute the divergence $\underline{D}s$.
Solve the Poisson equation:
  Perform a fast 2-D sine transform of $s_{ijk}$ to determine the hybrid Fourier coefficients.
  Solve the resulting tri-diagonal system. Methods include LU factorization, forward substitution, and backward substitution.
  Perform a 2-D (inverse) sine transform of the resulting solution of the tridiagonal system.
  The result is $\underline{L}^{-1}\underline{D}s$.
Take the gradient, i.e., $\underline{G}\underline{L}^{-1}\underline{D}s$.
Subtract the result from the original measurement s.

In order to evaluate quantitatively the numerical solution given above, we numerically generated a velocity field that is divergence-free. For certain fluid mechanical systems, a closed-form solution to the incompressible, and therefore divergence-free, Navier-Stokes equation is available. One such example is that of Couette flow. This flow is divergence-free and is ideally suited to determine the performance of the proposed method.

Figure 4:
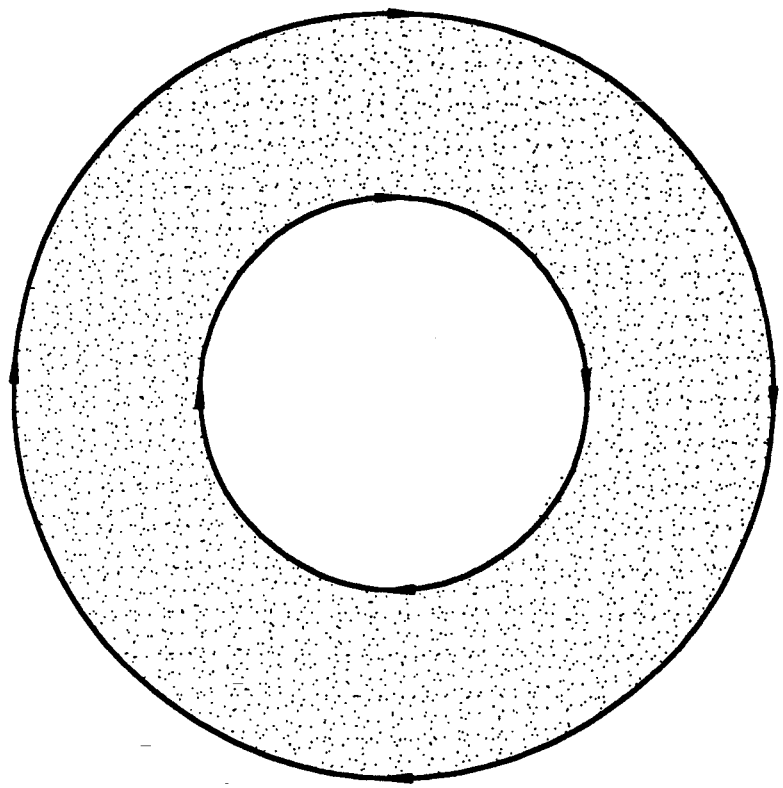
FIG. 4 is a section view of a Couette flow phantom.

The Couette flow generated by two concentric circularly rotating cylinders as shown in FIG. 4. The Navier-Stokes equation for this particular geometry can be solved in cylindrical coordinates and transformed to cartesian coordinates. It can be shown that the velocity field of the fluid between the two cylinders is:

$$u = -(Ar + B/r) \sin(\theta)$$

$$v = (Ar + B/r) \cos(\theta) \quad (23)$$

where $$r = \sqrt{x^2 + y^2}$$

-continued $$\theta = \tan^{-1}(y/x)$$

and A and B are constants that depend on radii and angular velocities of the two cylinders. Thus, we are equipped with a non-trivial velocity field that is divergence-free.

We next describe the method that was used to generate the IQ samples from the known velocity field of the Couette flow. In 3-D PC MRI, a complex signal represented by (I,Q) corresponding to the complex value (I+iQ) is reconstructed for each pixel and the velocity is obtained by taking the phase difference of two or more measurements. For a realistic simulation, noise must be added to the IQ signal.

Given the velocity, (u,v,w), and the signal magnitude, S, all functions of space, we want to generate the PC measurements $(I_n, Q_n)$, for $n=1,2,\ldots,6$. Further, we assume identical signal magnitude for all measurements.

For the x-component, we have:

$$S^2 = I_1^2 + Q_1^2$$

$$S^2 = I_2^2 + Q_2^2$$

$$u = \beta(\tan^{-1}(Q_2/I_2) - \tan^{-1}(Q_1/I_1))$$

where $\beta$ is the proportionality constant that depends on the gyromagnetic ratio and the first moment of the gradient waveform. The above describes three equations but four unknowns. Therefore, without loss of generality, we let $Q_1=0$. Then, $$I_1 = S \quad (24)$$

$$Q_1 = 0$$

$$I_2 = \sqrt{S^2/(1 + \tan^2(u/\beta))}$$

$$Q_2 = I_2 \tan^2(u/\beta)$$

Other components of the velocity, v and w, can similarly be modeled. For simulation purposes, white Gaussian noise of specified SNR was added to all the IQ samples.

When the true velocity field, $s_{true}$, is known, as is the case for simulated data, the following figure of merit is a convenient measure of performance.

$$F = \frac{\|s_{true} - Ps\|_2}{\|s_{true} - s\|_2} \quad (25)$$

Thus, F is the ratio of the error in the projected velocity field Ps, obtained by the method of PSDF, and the error in the original velocity field s. We note that F=0 indicates perfect recovery, whereas F>1 implies inferior performance for PSDF as opposed to the original data.

To get a better measure of the performance of the PSDF method, we performed the following set of experiments using two different fields: zero flow and Couette flow fields (32×32 pixels). Noise was added to the predetermined velocity field; the PSDF method was applied to the resulting noisy field; and the figure of merit, F, was computed. This was repeated with a different seed 128 times. Then, the sample mean and the sample variance of 128 Fs were computed. The above process was performed in the SNR range of 1 to 10 in steps of 0.2. In total, 128×46 simulations were performed for each simulated flow field.

Figure 5A:
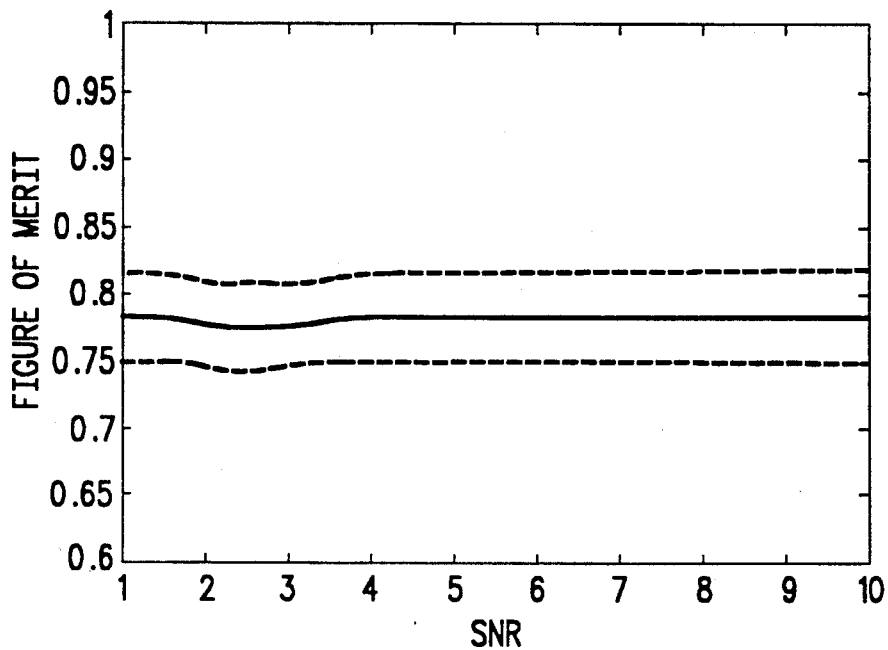
FIGS. 5A and 5B are graphs illustrating figure of merit versus signal to noise ratio for zero flow and for Couette flow, respectively.
Figure 5B:
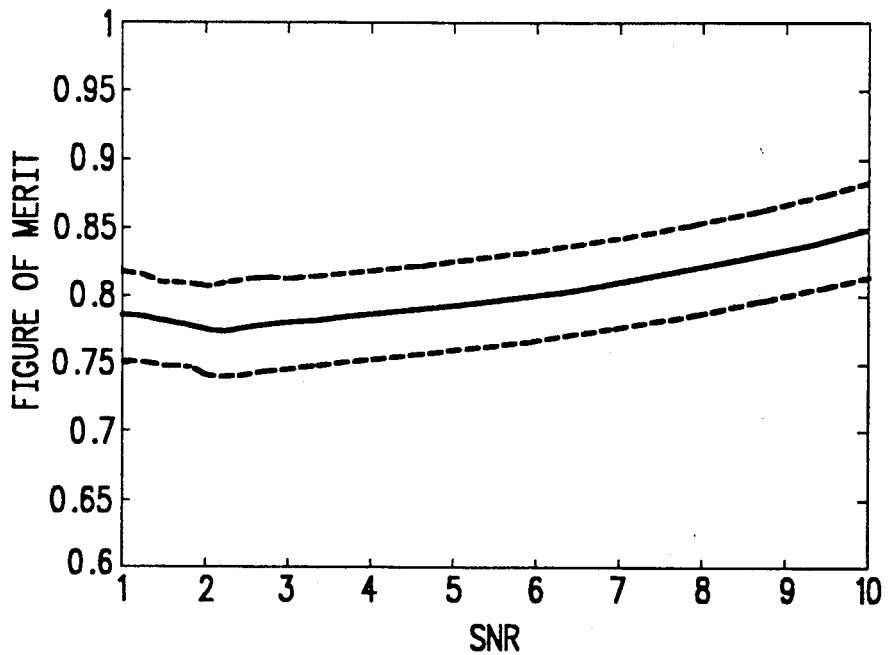
Figure 6:
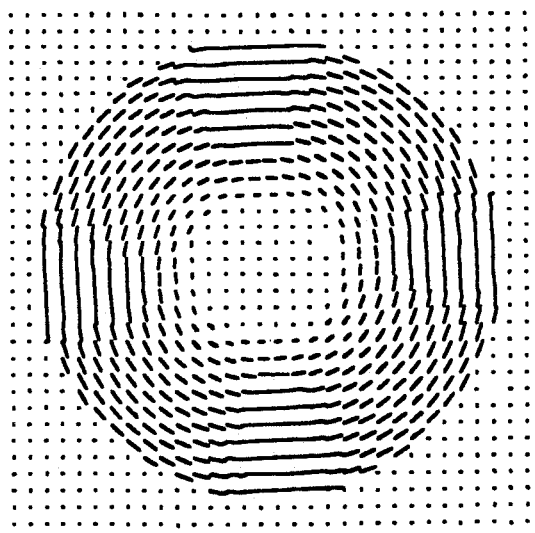
FIG. 6 illustrates Couette flow phantom flow field.

FIG. 5 shows the sample mean of the figure of merit F (solid line) as a function of SNR for (a) the trivial case of zero flow and (b) the Couette flow of FIG. 6. Dashed lines indicate $\pm\sigma$ from the sample mean, where $\sigma$ was estimated as the square root of the sample variance. In both plots, it can be seen that F lies between 0.75 and 0.85 in the most relevant range of $1 < SNR < 10$. Thus, for these cases, the improvement is on the order of 15 to 25% reduction in noise. We infer that the noise component that is divergence-free, together with the quantization noise introduced by the discretization procedure, must constitute 75 to 85% of the total noise.

Figure 7A:
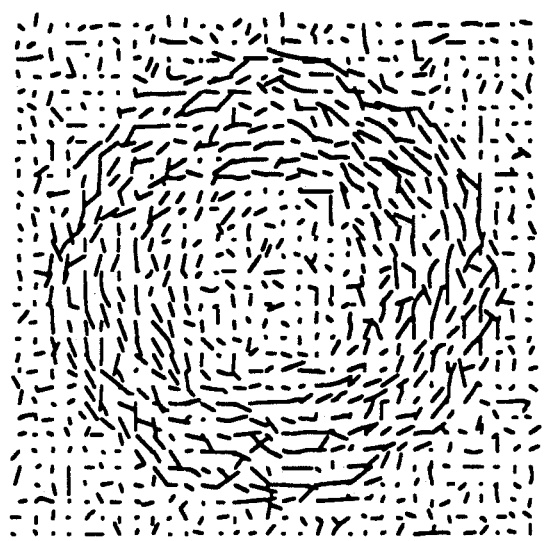
FIGS. 7A, 7B illustrate an original flow field and a flow field in accordance with the invention, respectively, for the Couette flow phantom.
Figure 7B:
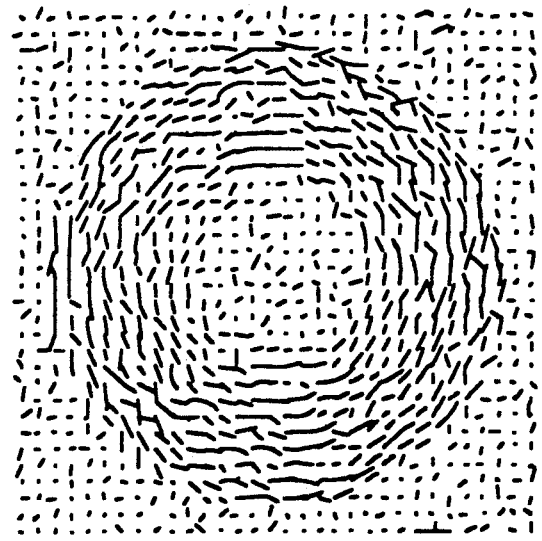

FIG. 6 shows the Couette flow phantom as described in Equation (23). The signal magnitude was normalized to 1 everywhere and the noise of SNR=4 was added to generate the noisy flow field of FIG. 7A. The noisy flow field was projected via the PSDF method and the results are shown in FIG. 7B. For this case the figure of merit F=0.84 suggesting an improvement of 16%. The visual improvement of the PSDF velocity 7B over the original velocity 7A is obvious as the PSDF velocity appears closer to the true flow field shown in FIG. 6. It was also this field that was used to generate the plot, F vs. SNR, in FIG. 5B.

Figure 8A:
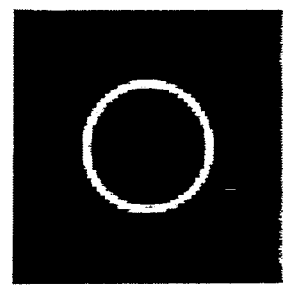
FIGS. 8A and 8B illustrate true speed of a low contrast Couette flow phantom and the cross-section at mid-image, respectively.
Figure 8B:
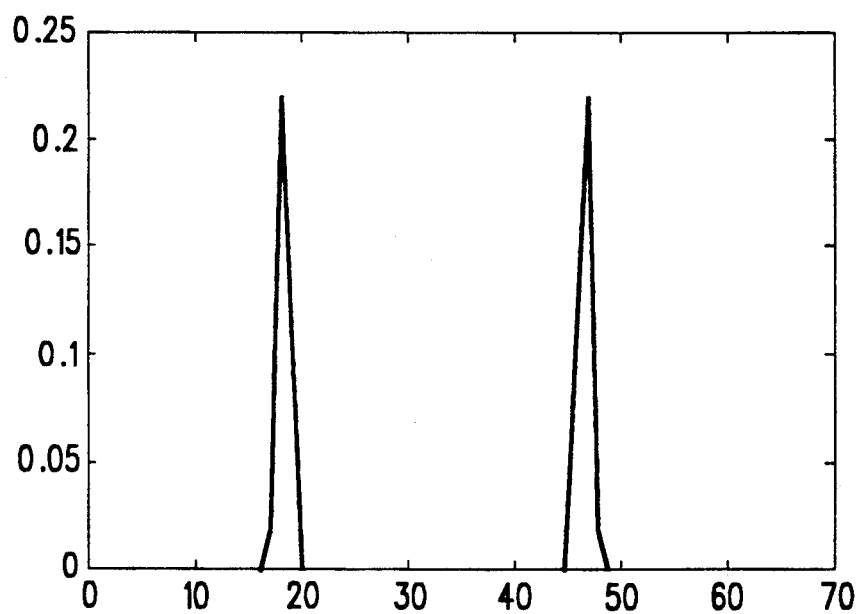

Careful observation of the previous experiment of Couette flow and the resulting improvement in F suggest that the visual impact may be greater for regions of low contrast. Thus, we determine the effect in low contrast regions. The region between the cylinders was narrowed and FIG. 8A shows the 64×64 speed image, and FIG. 8B shows the cross-section of the image shown in FIG. 8A. The MR signal magnitude was set proportional to the speed, normalized so that the highest signal is 1. For regions of zero flow (outside the fluid regions), the signal was set to 0.1 so that $\tan^{-1}$ remains well behaved in this region. The noise of peak SNR=10 was added to the IQ samples so that the flow regions are barely visible.

Figure 9A:
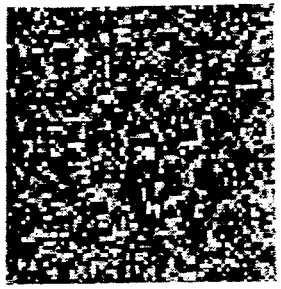
FIGS. 9A and 9B illustrate magnitude weighted speed images of an original Couette flow image and a PSDF velocity fields, respectively.
Figure 9B:
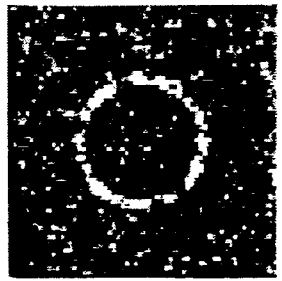
Figure 10A:
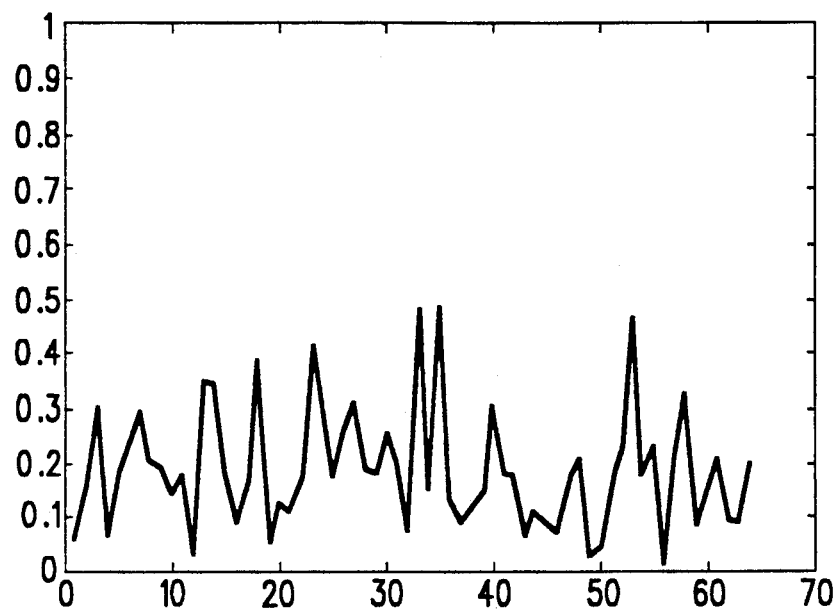
FIGS. 10A and 10B illustrate cross-sections at mid-image of the magnitude weighted speed images of the original and the PSDF velocity fields, respectively.
Figure 10B:
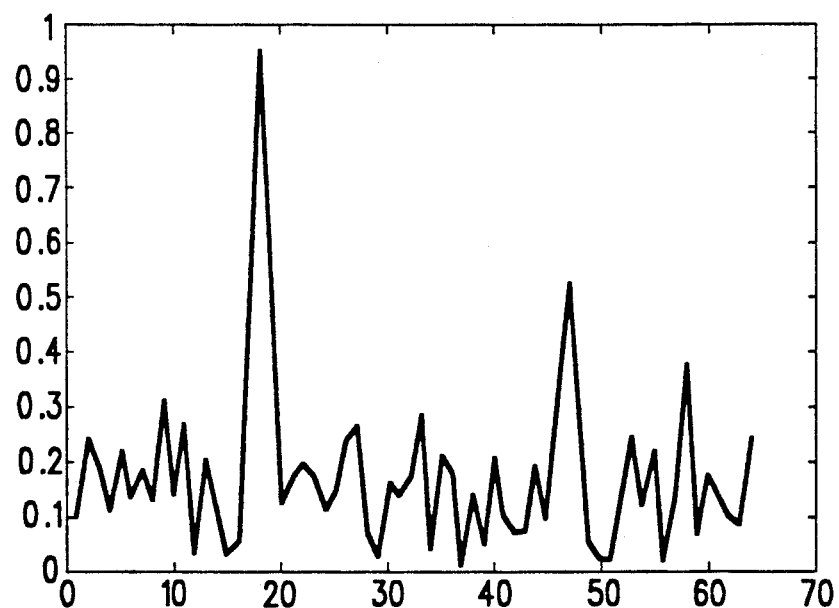

It is typical to display the magnitude weighted speed to alleviate large phase noise in regions of low signal. The magnitude weighted speed image of the narrow Couette phantom, the noisy version of the speed shown in FIG. 8A, is shown in FIG. 9A and the PSDF image is shown in FIG. 9B. FIG. 10 shows the cross sections of the noisy velocity (9A) and the PSDF velocity (9B). The figure of merit F=0.79 is found for this study. The decrease (improvement) in F over the previous example is only 5%. However, the visual impact of the current experiment is far greater.

Figure 11A:
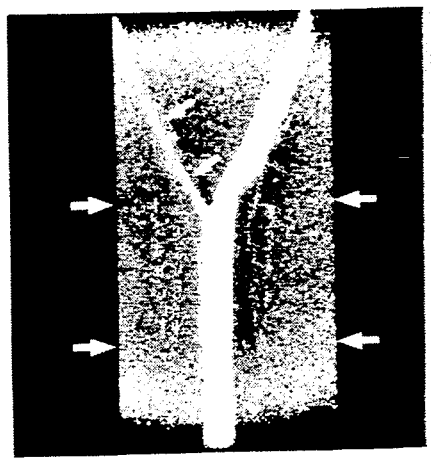
FIGS. 11A and 11B are images of a carotid bifurcation phantom with coronal collapse of the magnitude weighted speed images of the original and of the PSDF velocity fields, respectively.
Figure 11B:
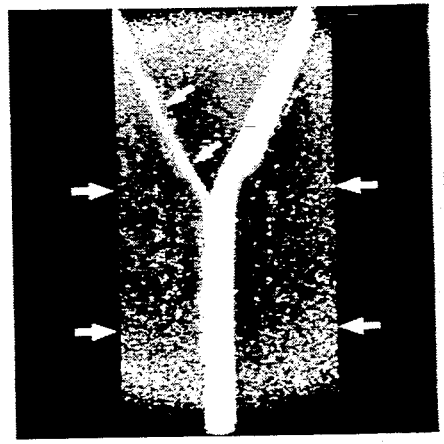
Figure 12:
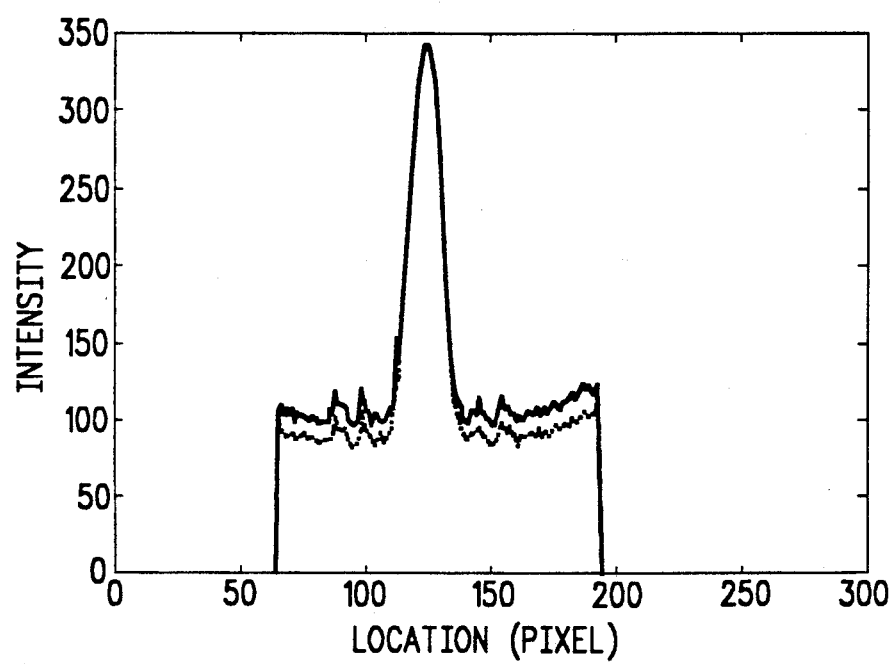
FIG. 12 illustrates average cross-section of the carotid bifurcation phantom of FIG. 11.
Figure 13A:
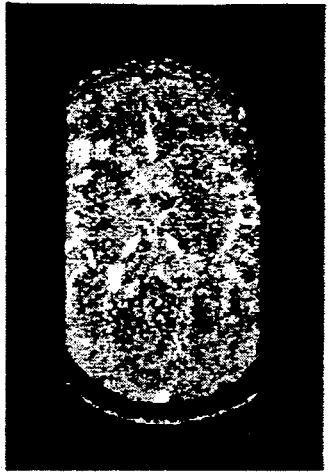
FIGS. 13A–13D illustrate axial collapse of data.
Figure 13B:
Figure 13C:
Figure 13D:
Figure 14A:
FIGS. 14A–14D illustrate anterior-posterior MIP data further illustrating application of the invention.
Figure 14B:
Figure 14C:
Figure 14D:
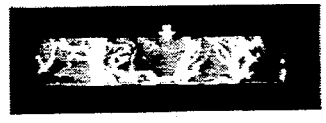

We next present the result obtained with a real flow phantom. 3-D PC MRI data (FOV=10 cm, twenty-eight 0.5 mm coronal sections) were acquired from an anatomically accurate carotid bifurcation phantom surrounded by gel and driven by a computer-controlled flow simulator delivering constant flow of 9 l/s and Re=400. FIG. 11A shows the maximum intensity projection (MIP) of the magnitude weighted speed images (coronal collapse). FIG. 11B shows the PSDF version. Since the true velocity field for this phantom is not known, we estimated $s_{true}$ with the average of eight identically acquired data sets. This example resulted in F=0.88. In the regions of small flow in the left branch (see small slanted arrows) the contrast of the vessel appears greater in the PSDF image. In the large flow region, it is difficult to visualize the differences in contrast. However, by taking advantage of the coherent central structure, the pixel values were summed vertically in the region indicated by four large arrows. FIG. 12 shows the average pixel values as a function of x position. The solid line is from the original image and the dotted line is from the PSDF image. It can be seen that the background intensity decreased for the PSDF and peak intensities were unchanged.

In addition, the same region was used in computing the contrast to noise ratio (CNR) defined as follows:

$$CNR = \frac{S_a - S_b}{(h_a \sigma_a^2 + h_b \sigma_b^2)^{\frac{1}{2}}} \quad (26)$$

where ($S_a, S_b$) = flow signal (region a), and background signal (region b)
($h_a, h_b$) = size of regions a and b
($\sigma_a^2, \sigma_b^2$) = variance in regions a and b.

We estimate $S_a$ as the peak signal in the flow region, S and $\sigma_b^2$ as the sample mean and the sample variance in the background gel region. Further, it is reasonable to assume that $\sigma_a^2 << \sigma_b^2$ and thus, $h_a \sigma_a^2 << h_b \sigma_b^2$ With the above definition, the CNR was found to be 19.73 and 24.50 for the original and PSDF velocity respectively, resulting in CNR improvement of 24%.

In several in vivo studies, we have verified noise reduction and contrast improvement. To better quantify this effect, we acquired two sets of 3-D PC MR (FOV=25.6 cm, twenty-eight 1 mm axial sections, 1.5 T GE Signa System) velocity data from the same volunteer—1 NEX and 2 NEX. The method of PSDF was applied to both sets and we compare the MIPs of these data sets. FIG. 13 shows superior-inferior MIPs (axial collapse) of slices 19-26 for 1 NEX (13A), 1 NEX PSDF (13B), 2 NEX (13C), and 2 NEX PSDF (13D) data sets. It can be seen that the background noise is suppressed in PSDF images resulting in superior contrast. Thus, small vessels (arrows) appear less noisy.

FIG. 14 shows anterior-posterior MIP of the same data in the same order. Barely visible small vessel (arrow) in the 1 NEX image (14A) appears sharper in the 1 NEX PSDF image (14B), and the 2 NEX image (14C) appears slightly better than the 1 NEX PSDF image (14B) and the 2 NEX PSDF image appears even better (14D). Since by doubling the number of excitations, the SNR gain of $\sqrt{2}$ is achieved, this study suggests that the effective SNR gain via the PSDF method is greater than 1, but less than $\sqrt{2}$.

In the above detailed description, we have introduced the method of PSDF and applied it to 3-D PC MRI. The Hilbert space setting is conveniently used in developing the projection operator, which is then discretized. An efficient numerical algorithm based on FFTs is implemented. Efficacy of the PSDF method has been demonstrated with a mathematical phantom, a flow phantom, and various in vivo studies. In all cases, the contrast improved, indicative of the noise reduction.

While the invention has been described with reference to a specific embodiment of implementing the method of projection onto the space of divergence-free fields (PSDF) as applied to three-dimensional phase contrast magnetic resonance imaging, the description is illustrative of the invention and is not to be construed as limiting the invention. Mathematical variations implementing the invention including the use of least squares iterative approaches, and the applicability to other velocity determining technologies such as laser Doppler or ultrasound imaging, can be implemented. Thus, various modifications and applications may occur to those skilled in the art without departing from the true spirit and scope of the invention as defined by the appended claims.

What is claimed is:

1. A method of enhancing a measured velocity field with non-zero divergence comprising the steps of:
    (a) defining a space of divergence-free velocity fields;
    (b) projecting said measured velocity field onto said space of divergence-free fields to find the divergence-free field which is closest to the measured velocity field.

2. The method as defined by claim 1 wherein step (b) includes a vector projection in Hilbert space.

3. The method as defined by claim 2 wherein step (b) further includes a projection operator P for projecting measured field vector s∈H onto a space, M, of divergence-free vector fields where H is the Hilbert space.

4. The Method of claim 3 wherein said projection operator, P, is defined as $$P = I - GL^{-1}D$$

where
I is an identity matrix,
G is a gradient operator,
L is a Laplacian operator, and
D is a divergence operator.

5. The method as defined by claim 4 wherein L is approximated by a Laplacian mask whereby diagonalization is performed by a sine transform.

6. The method as defined by claim 3 wherein said projection operator is obtained by linear algebraic formulation.

7. The method as defined by claim 1 wherein said measured velocity field is obtained by magnetic resonance imaging.

8. The method as defined by claim 7 wherein said measured velocity field represents the motion of incompressible fluid.

9. The method as defined by claim 1 wherein said measured velocity field is obtained by Doppler ultrasound.

10. The method as defined by claim 9 wherein said measured velocity field represents the motion of incompressible fluid.

11. The method as defined by claim 8 and further including:
    (c) producing an image of flow of said fluid based on said divergence-free field.

12. A method of improving signal to noise ratio of three-dimensional phase contrast magnetic resonance imaging signals from an incompressible medium such as blood flowing in vessels comprising the steps of:
    (a) obtaining signals representative of the velocity of motion at a plurality of voxels, and
    (b) applying a divergence-free constraint to said signals by a vector projection operation, whereby noise components of said signals are reduced.

13. The method as defined by claim 12 wherein in step (b) said vector projection includes an orthogonal decomposition of a vector field.

14. The method as defined by claim 13 wherein step (b) includes a vector projection in Hilbert space.

15. The method as defined by claim 14 wherein step (b) further includes a projection operator P for projecting a measured vector field s∈H onto a space, M, of divergence-free vector fields where H is the Hilbert space.

16. The method as defined by claim 15 wherein said projection operator, P, is defined as $$P = I - GL^{-1}D$$

where
- I is an identity matrix,
- G is a gradient operator,
- L is a Laplacian operator, and
- D is a divergence operator.

17. The method as defined by claim 16 wherein L is approximated by a Laplacian mask whereby diagonalization is performed by a sine transform.

18. The method as defined by claim 15 wherein said projection operator is obtained by linear algebraic formulation.

19. Apparatus for producing an angiogram of the flow of blood in vessels of a body comprising:
   (a) means for obtaining phase contrast magnetic resonance signals indicative of flow velocity,
   (b) means for projecting said signals onto a space of divergence-free fields,
   (c) means for extracting from said space signal components in which noise is reduced, and
   (d) means for producing an angiogram of flow based on said signal components.

20. Apparatus as defined by claim 19 wherein element (b) includes a vector projection in Hilbert space.

21. Apparatus for enhancing a measured velocity field with non-zero divergence comprising
   (a) means for defining a space of divergence-free velocity fields, and
   (b) means for projecting said measured velocity field onto said space of divergence-free fields to find a divergence-free field which is closest to said measured velocity field.

22. Apparatus as defined by claim 21 wherein said measured velocity field represents the motion of incompressible fluid and further including
   (c) means for producing an image of flow of said fluid based on said divergence-free field.

23. Apparatus for improving signal to noise ratio of three-dimensional phase contrast magnetic resonance imaging signals from an incompressible medium such as blood flowing in vessels comprising
   (a) means for obtaining signals representative of the velocity of motion at a plurality of voxels, and
   (b) means for applying a divergence-free constraint to said signals by a vector projection operation, whereby noise components of said signals are reduced.

24. Apparatus as defined by claim 23 wherein said vector projection includes an orthogonal decomposition of a vector field.

25. Apparatus as defined by claim 24 wherein said means for applying a divergence-free constraint applies a vector projection in Hilbert space.

26. Apparatus as defined by claim 25 wherein said means for applying a divergence-free constraint includes a projection operator P for projecting a measured vector field $s \in H$ onto a space, M, of divergence-free vector fields where H is the Hilbert space.

27. Apparatus as defined by claim 26 wherein said projection operator, P, is defined as $$P = I - GL^{-1}D$$

where
- I is an identity matrix,
- G is a gradient operator,
- L is a Laplacian operator, and
- D is a divergence operator.

28. Apparatus as defined by claim 27 wherein L is approximated by a Laplacian mask whereby diagonalization is performed by a sine transform.

29. Apparatus as defined by claim 26 wherein said projection operator is obtained by linear algebraic formulation.

* * * * *